United States Patent
Chen et al.

(10) Patent No.: US 11,644,759 B2
(45) Date of Patent: *May 9, 2023

(54) DROPLET GENERATOR AND METHOD OF SERVICING EXTREME ULTRAVIOLET RADIATION SOURCE APPARATUS

(71) Applicant: TAIWAN SEMICONDUCTOR MANUFACTURING COMPANY, LTD., Hsinchu (TW)

(72) Inventors: Yen-Hsun Chen, Taipei (TW);
Ming-Hsun Tsai, Hsinchu (TW);
Shao-Hua Wang, Taoyuan (TW);
Han-Lung Chang, Kaohsiung (TW);
Li-Jui Chen, Hsinchu (TW);
Chia-Chen Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 15 days.

This patent is subject to a terminal disclaimer.

(21) Appl. No.: 17/340,874

(22) Filed: Jun. 7, 2021

(65) Prior Publication Data
US 2021/0294226 A1   Sep. 23, 2021

Related U.S. Application Data

(63) Continuation of application No. 16/933,872, filed on Jul. 20, 2020, now Pat. No. 11,029,613, which is a (Continued)

(51) Int. Cl.
*G03F 7/20*   (2006.01)
*H05G 2/00*   (2006.01)

(52) U.S. Cl.
CPC ...... *G03F 7/70925* (2013.01); *G03F 7/70033* (2013.01); *H05G 2/005* (2013.01); *H05G 2/008* (2013.01)

(58) Field of Classification Search
CPC . G03F 7/70925; G03F 7/70033; H05G 2/005; H05G 2/006; H05G 2/008
See application file for complete search history.

(56) References Cited

U.S. PATENT DOCUMENTS 8,292,698 B1 * 10/2012 Shih .................. B24C 1/003
451/39
8,796,666 B1   8/2014 Huang et al.
(Continued)

FOREIGN PATENT DOCUMENTS

CN      103240242 A    8/2013
CN      104492761 A    4/2015
(Continued)

OTHER PUBLICATIONS

Notice of Allowance issued in U.S. Appl. No. 16/404,235, dated Mar. 18, 2020.
(Continued)

*Primary Examiner* — David E Smith
(74) *Attorney, Agent, or Firm* — McDermott Will & Emery LLP

(57) ABSTRACT

An extreme ultraviolet radiation source apparatus includes a chamber including at least a droplet generator, a nozzle of the droplet generator, and a dry ice blasting assembly. The droplet generator includes a reservoir for a molten metal, and the nozzle has a first end connected to the reservoir and a second opposing end where molten metal droplets emerge from the nozzle. The dry ice blasting assembly includes a blasting nozzle, a blasting air inlet and a blaster carbon dioxide ($CO_2$) inlet. The blasting nozzle is disposed inside the chamber. The blasting nozzle is arranged to direct a pressurized air stream and dry ice particles at the nozzle of the droplet generator.

20 Claims, 10 Drawing Sheets

Related U.S. Application Data continuation of application No. 16/404,235, filed on May 6, 2019, now Pat. No. 10,719,020.

(60) Provisional application No. 62/692,565, filed on Jun. 29, 2018.

(56) References Cited

U.S. PATENT DOCUMENTS

| | | |
|---|---|---|
| 9,093,530 B2 | 7/2015 | Huang et al. |
| 9,184,054 B1 | 11/2015 | Huang et al. |
| 9,256,123 B2 | 2/2016 | Shih et al. |
| 9,529,268 B2 | 12/2016 | Chang et al. |
| 9,548,303 B2 | 1/2017 | Lee et al. |
| 9,618,837 B2 | 4/2017 | Lu et al. |
| 9,869,928 B2 | 1/2018 | Huang et al. |
| 9,869,934 B2 | 1/2018 | Huang et al. |
| 9,869,939 B2 | 1/2018 | Yu et al. |
| 10,719,020 B2 * | 7/2020 | Chen .................. G03F 7/70033 |
| 11,029,613 B2 * | 6/2021 | Chen ...................... H05G 2/008 |
| 2005/0003741 A1 | 1/2005 | Carroll |
| 2006/0192153 A1 | 8/2006 | Bykanov et al. |
| 2010/0025231 A1 | 2/2010 | Moriya et al. |
| 2010/0192973 A1 | 8/2010 | Ueno et al. |
| 2012/0286176 A1 * | 11/2012 | Rajyaguru ............. H05G 2/006 250/504 R |
| 2013/0032640 A1 * | 2/2013 | Yabu ....................... B05B 15/52 239/114 |
| 2013/0306101 A1 | 11/2013 | Swanson et al. |
| 2016/0062251 A1 * | 3/2016 | Machida ................ H05G 2/005 359/507 |
| 2016/0207078 A1 * | 7/2016 | Becker ............... G02B 27/0006 |

FOREIGN PATENT DOCUMENTS

| | | |
|---|---|---|
| CN | 205413751 U | 8/2016 |
| CN | 108114933 A | 6/2018 |
| EP | 2305425 A1 | 4/2011 |

OTHER PUBLICATIONS

Non-Final Office Action issued in U.S. Appl. No. 16/933,872, dated Oct. 26, 2020.

Notice of Allowance issued in U.S. Appl. No. 16/933,872, dated Feb. 10, 2021.

* cited by examiner

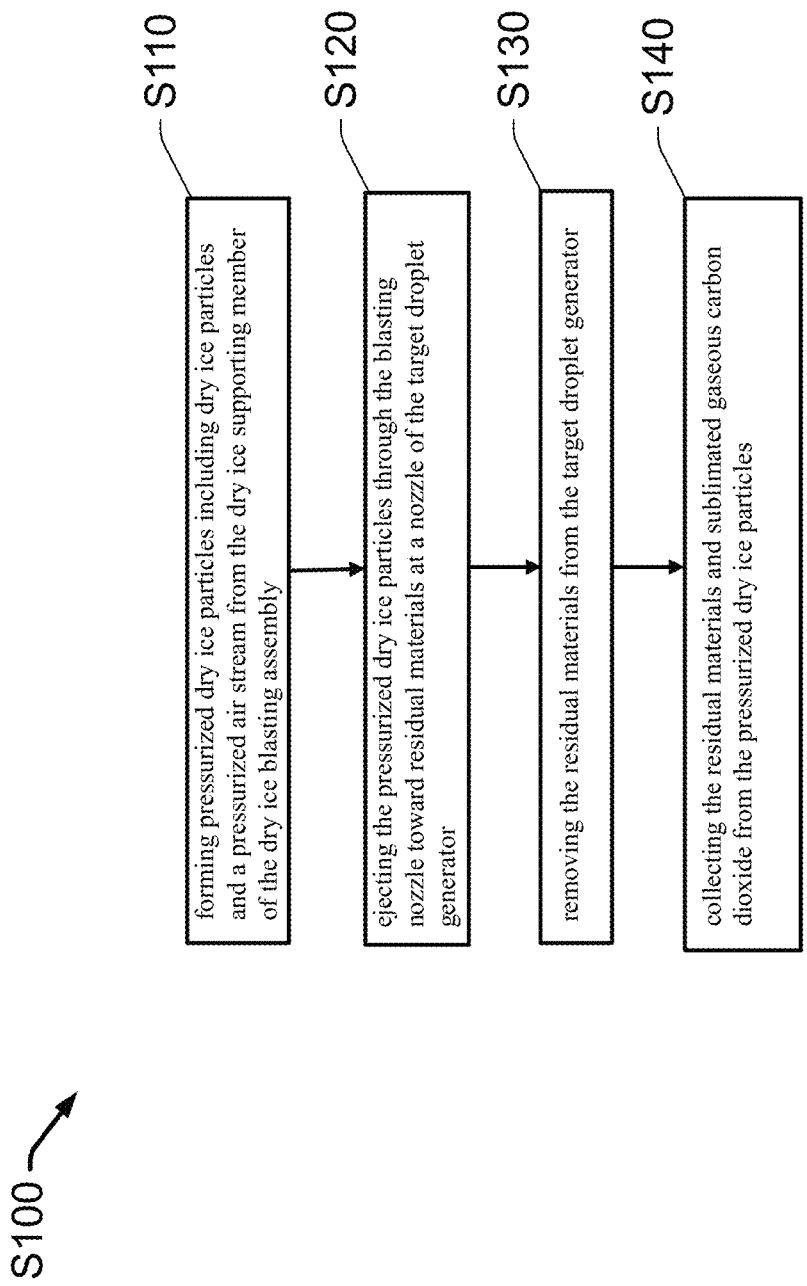

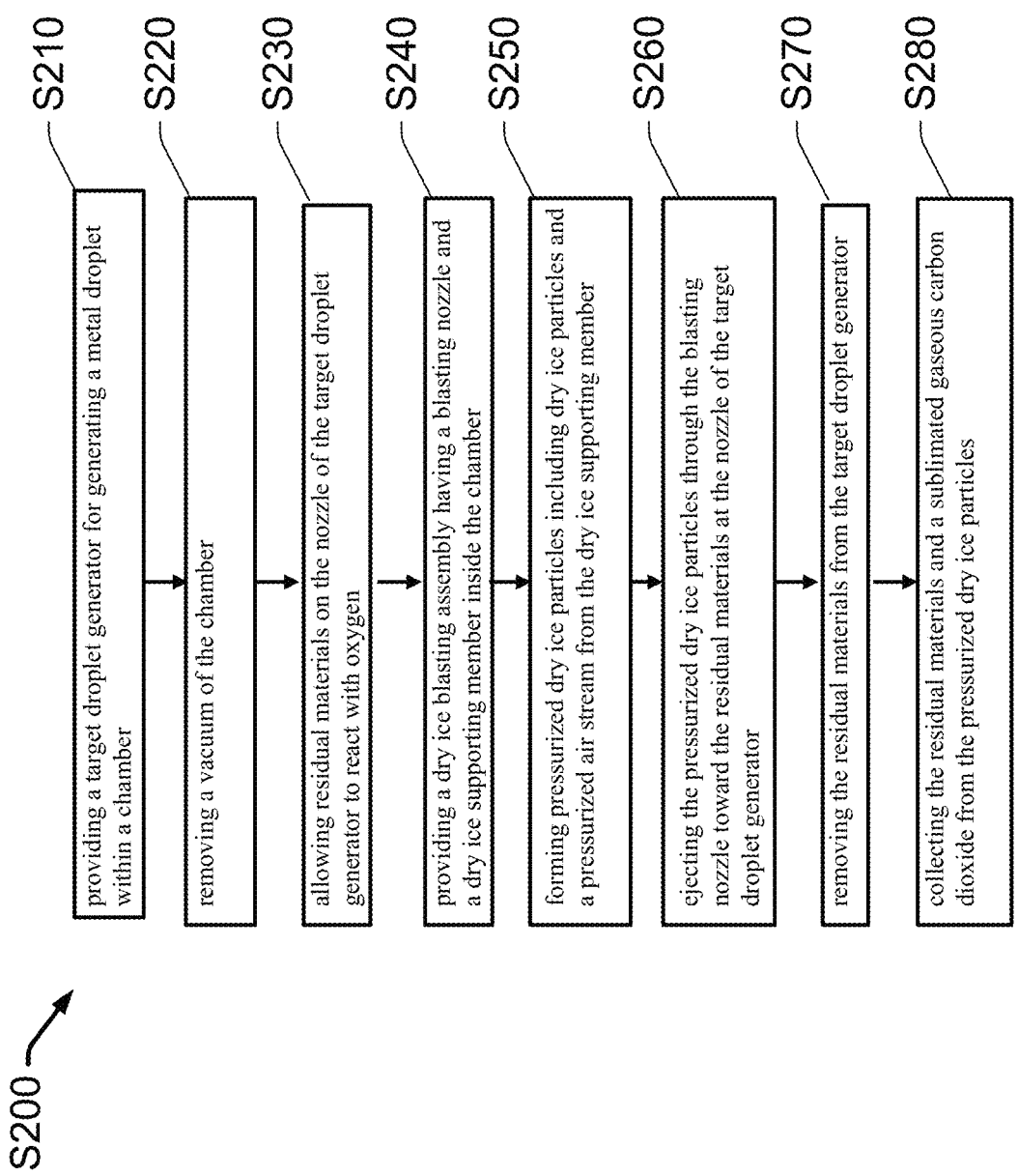

DROPLET GENERATOR AND METHOD OF SERVICING EXTREME ULTRAVIOLET RADIATION SOURCE APPARATUS

RELATED APPLICATION

This application is a Continuation Application of U.S. patent application Ser. No. 16/933,872 filed Jul. 20, 2020, now U.S. Pat. No. 11,029,613, which is a Continuation Application of U.S. patent application Ser. No. 16/404,235 filed May 6, 2019, now U.S. Pat. No. 10,719,020, which claims priority to U.S. Provisional Patent Application No. 62/692,565 filed on Jun. 29, 2018, the entire contents of each of which are incorporated herein by reference.

BACKGROUND

As consumer devices have gotten smaller and smaller in response to consumer demand, the individual components of these devices have necessarily decreased in size as well. Semiconductor devices, which make up a major component of devices such as mobile phones, computer tablets, and the like, have been pressured to become smaller and smaller, with a corresponding pressure on the individual devices (e.g., transistors, resistors, capacitors, etc.) within the semiconductor devices to also be reduced in size. The decrease in size of devices has been met with advancements in semiconductor manufacturing techniques such as lithography.

For example, the wavelength of radiation used for lithography has decreased from ultraviolet to deep ultraviolet (DUV) and, more recently to extreme ultraviolet (EUV). Further decreases in component size require further improvements in resolution of lithography which are achievable using extreme ultraviolet lithography (EUVL). EUVL employs radiation having a wavelength of about 1-100 nm.

As the semiconductor industry has progressed into nanometer technology process nodes in pursuit of higher device density, higher performance, and lower costs, there have been challenges in reducing semiconductor feature size.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 8 shows a flow chart of a method of cleaning a droplet generator of an EUV radiation source apparatus according to an embodiment of the disclosure.

FIG. 9 shows a flow chart of a method of cleaning the droplet generator of the EUV radiation source apparatus according to another embodiment of the disclosure.

DETAILED DESCRIPTION

Figure 1:
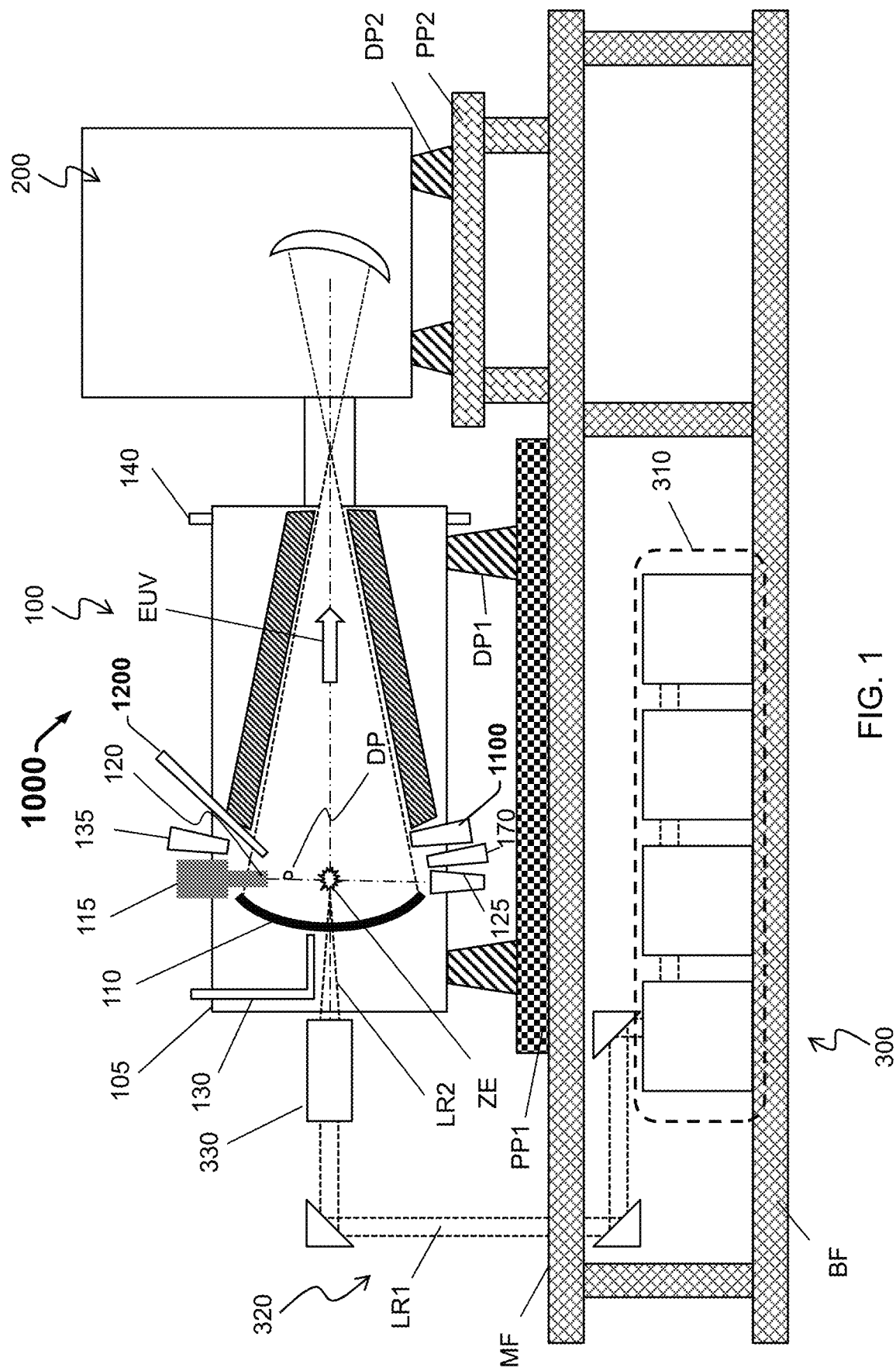
FIG. 1 shows an extreme ultraviolet lithography tool according to an embodiment of the disclosure.

It is to be understood that the following disclosure provides many different embodiments, or examples, for implementing different features of the disclosure. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

The present disclosure is generally related to extreme ultraviolet (EUV) lithography systems and methods. More particularly, it is related to extreme ultraviolet lithography (EUVL) tools and methods of servicing the tools. In an EUVL tool, a laser-produced plasma (LPP) generates extreme ultraviolet radiation which is used to image a photoresist coated substrate. In an EUV tool, an excitation laser heats metal (e.g., tin, lithium, etc.) target droplets in the LPP chamber to ionize the droplets to plasma which emits the EUV radiation. For reproducible generation of EUV radiation, the target droplets arriving at the focal point (also referred to herein as the "zone of excitation") have to be substantially the same size and arrive at the zone of excitation at the same time as an excitation pulse from the excitation laser arrives. Thus, stable generation of target droplets that travel from the target droplet generator 115 to the zone of excitation at a uniform (or predictable) speed contributes to efficiency and stability of the LPP EUV radiation source. Any instability in the generation of target droplets can impact the EUVL tool performance, and in some cases, for example, if the nozzle 120 of the droplet generator 115 is clogged, the tool may have to be shut down to repair (e.g., unclog the nozzle 120) the droplet generator 115. Additionally, when refilling the droplet generator 115, there is a possibility of oxidation of tin, which can cause clogging of the nozzle 120. In such cases of a clogged nozzle 120, the entire droplet generator 115 needs to be changed, causing long downtime for the EUVL tool. Embodiments of the present disclosure provide for an apparatus and methods for cleaning and/or unclogging a droplet generator 115 without removing the droplet generator 115 from the EUVL tool. In other words, the presently disclosed embodiments enable in-line cleaning and/or unclogging of the droplet generator 115.

FIG. 1 is a schematic view of an EUV lithography tool with a laser production plasma (LPP) based EUV radiation source, constructed in accordance with some embodiments of the present disclosure. The EUV lithography system includes an EUV radiation source 100 to generate EUV radiation, an exposure device 200, such as a scanner, and an excitation laser source 300. As shown in FIG. 1, in some embodiments, the EUV radiation source 100 and the exposure device 200 are installed on a main floor MF of a clean room, while the excitation laser source 300 is installed on a base floor BF located under the main floor. Each of the EUV radiation source 100 and the exposure device 200 are placed over pedestal plates PP1 and PP2 via dampers DP1 and DP2, respectively. The EUV radiation source 100 and the exposure device 200 are coupled to each other by a coupling mechanism, which may include a focusing unit.

The EUV lithography tool is designed to expose a resist layer by EUV light (also interchangeably referred to herein as EUV radiation). The resist layer is a material sensitive to the EUV light. The EUV lithography system employs the EUV radiation source 100 to generate EUV light, such as EUV light having a wavelength ranging between about 1 nm and about 100 nm. In one particular example, the EUV radiation source 100 generates an EUV light with a wavelength centered at about 13.5 nm. In the present embodiment, the EUV radiation source 100 utilizes a mechanism of laser-produced plasma (LPP) to generate the EUV radiation.

The exposure device 200 includes various reflective optic components, such as convex/concave/flat mirrors, a mask holding mechanism including a mask stage, and wafer holding mechanism. The EUV radiation EUV generated by the EUV radiation source 100 is guided by the reflective optical components onto a mask secured on the mask stage. In some embodiments, the mask stage includes an electrostatic chuck (e-chuck) to secure the mask.

As used herein, the term "optic" is meant to be broadly construed to include, and not necessarily be limited to, one or more components which reflect and/or transmit and/or operate on incident light, and includes, but is not limited to, one or more lenses, windows, filters, wedges, prisms, grisms, gratings, transmission fibers, etalons, diffusers, homogenizers, detectors and other instrument components, apertures, axicons and mirrors including multi-layer mirrors, near-normal incidence mirrors, grazing incidence mirrors, specular reflectors, diffuse reflectors and combinations thereof. Moreover, unless otherwise specified, neither the term "optic", as used herein, are meant to be limited to components which operate solely or to advantage within one or more specific wavelength range(s) such as at the EUV output light wavelength, the irradiation laser wavelength, a wavelength suitable for metrology or any other specific wavelength.

Because gas molecules absorb EUV light, the lithography system for the EUV lithography patterning is maintained in a vacuum or a low pressure environment to avoid EUV intensity loss.

In the present disclosure, the terms mask, photomask, and reticle are used interchangeably. In the present embodiment, the patterning optic is a reflective mask. In an embodiment, the reflective mask includes a substrate with a suitable material, such as a low thermal expansion material or fused quartz. In various examples, the material includes $TiO_2$ doped $SiO_2$, or other suitable materials with low thermal expansion. The reflective mask includes multiple reflective multiple layers (ML) deposited on the substrate. The ML includes one or more film pairs, such as molybdenum-silicon (Mo/Si) film pairs (e.g., a layer of molybdenum above or below a layer of silicon in each film pair). Alternatively, the ML may include molybdenum-beryllium (Mo/Be) film pairs, or other suitable materials that are configured to highly reflect the EUV light. The mask may further include a capping layer, such as ruthenium (Ru), disposed on the ML for protection. The mask further includes an absorption layer, such as a tantalum boron nitride (TaBN) layer, deposited over the ML. The absorption layer is patterned to define a layer of an integrated circuit (IC). Alternatively, another reflective layer may be deposited over the ML and is patterned to define a layer of an integrated circuit, thereby forming an EUV phase shift mask.

The EUVL tool further includes other modules or is integrated with (or coupled with) other modules in some embodiments.

As shown in FIG. 1, the EUV radiation source 100 includes a target droplet generator 115 and a LPP collector 110, enclosed by a chamber 105. In various embodiments, the target droplet generator 115 includes a reservoir 150 (see FIG. 3) to hold a source material and a nozzle 120 through which target droplets DP of the source material are supplied into the chamber 105. The EUV radiation source 100 may further include a dry ice blasting assembly 1000 that includes a blasting member 1100 and an exhaust member 1200 selectively attachable to and extendable from the chamber 105. FIG. 1 illustrates an exemplary configuration of the dry ice blasting assembly 1000. However, any appropriate configuration such as size, shape, and location with respect to the chamber 105 is contemplated and is not limited in this regard.

In some embodiments, the target droplets DP are droplets of tin (Sn), lithium (Li), or an alloy of Sn and Li. In some embodiments, the target droplets DP each have a diameter in a range from about 10 microns (μm) to about 100 μm. For example, in an embodiment, the target droplets DP are tin droplets, having a diameter of about 10 μm to about 100 μm. In other embodiments, the target droplets DP are tin droplets having a diameter of about 25 μm to about 50 μm. In some embodiments, the target droplets DP are supplied through the nozzle 120 at a rate in a range from about 50 droplets per second (i.e., an ejection-frequency of about 50 Hz) to about 50,000 droplets per second (i.e., an ejection-frequency of about 50 kHz). In some embodiments, the target droplets DP are supplied at an ejection-frequency of about 100 Hz to a about 25 kHz. In other embodiments, the target droplets DP are supplied at an ejection frequency of about 500 Hz to about 10 kHz. The target droplets DP are ejected through the nozzle 120 and into a zone of excitation ZE at a speed in a range of about 10 meters per second (m/s) to about 100 m/s in some embodiments. In some embodiments, the target droplets DP have a speed of about 10 m/s to about 75 m/s. In other embodiments, the target droplets have a speed of about 25 m/s to about 50 m/s.

Referring back to FIG. 1, an excitation laser LR2 generated by the excitation laser source 300 is a pulse laser. The laser pulses LR2 are generated by the excitation laser source 300. The excitation laser source 300 may include a laser generator 310, laser guide optics 320 and a focusing apparatus 330. In some embodiments, the laser source 310 includes a carbon dioxide ($CO_2$) or a neodymium-doped yttrium aluminum garnet (Nd:YAG) laser source with a wavelength in the infrared region of the electromagnetic spectrum. For example, the laser source 310 has a wavelength of 9.4 μm or 10.6 μm, in an embodiment. The laser light LR1 generated by the laser generator 300 is guided by the laser guide optics 320 and focused into the excitation laser LR2 by the focusing apparatus 330, and then introduced into the EUV radiation source 100.

In some embodiments, the excitation laser LR2 includes a pre-heat laser and a main laser. In such embodiments, the pre-heat laser pulse (interchangeably referred to herein as the "pre-pulse) is used to heat (or pre-heat) a given target droplet to create a low-density target plume with multiple smaller droplets, which is subsequently heated (or reheated) by a pulse from the main laser, generating increased emission of EUV light.

In various embodiments, the pre-heat laser pulses have a spot size about 100 μm or less, and the main laser pulses have a spot size in a range of about 150 μm to about 300 μm. In some embodiments, the pre-heat laser and the main laser pulses have a pulse-duration in the range from about 10 ns to about 50 ns, and a pulse-frequency in the range from about 1 kHz to about 100 kHz. In various embodiments, the pre-heat laser and the main laser have an average power in the range from about 1 kilowatt (kW) to about 50 kW. The pulse-frequency of the excitation laser LR2 is matched with the ejection-frequency of the target droplets DP in an embodiment.

The laser light LR2 is directed through windows (or lenses) into the zone of excitation ZE. The windows adopt a suitable material substantially transparent to the laser beams. The generation of the pulse lasers is synchronized with the ejection of the target droplets DP through the nozzle 120. As the target droplets move through the excitation zone, the pre-pulses heat the target droplets and transform them into low-density target plumes. A delay between the pre-pulse and the main pulse is controlled to allow the target plume to form and to expand to an optimal size and geometry. In various embodiments, the pre-pulse and the main pulse have the same pulse-duration and peak power. When the main pulse heats the target plume, a high-temperature plasma is generated. The plasma emits EUV radiation, which is collected by the collector mirror 110. The collector 110 further reflects and focuses the EUV radiation for the lithography exposing processes performed through the exposure device 200. The droplet catcher 125 is used for catching excessive target droplets. For example, some target droplets may be purposely missed by the laser pulses.

Referring back to FIG. 1, the collector 110 is designed with a proper coating material and shape to function as a mirror for EUV collection, reflection, and focusing. In some embodiments, the collector 110 is designed to have an ellipsoidal geometry. In some embodiments, the coating material of the collector 100 is similar to the reflective multilayer of the EUV mask. In some examples, the coating material of the collector 110 includes a ML (such as one or more Mo/Si film pairs) and may further include a capping layer (such as Ru) coated on the ML to substantially reflect the EUV light. In some embodiments, the collector 110 may further include a grating structure designed to effectively scatter the laser beam directed onto the collector 110. For example, a silicon nitride layer is coated on the collector 110 and is patterned to have a grating pattern.

As shown in FIG. 1, in the present embodiment, a buffer gas is supplied from a first buffer gas supply 130 through the aperture in collector 110 by which the pulse laser is delivered to the tin droplets. In some embodiments, the buffer gas is $H_2$, He, Ar, $N_2$ or another inert gas. In certain embodiments, H radicals generated by ionization of the $H_2$ buffer gas is used for cleaning purposes. The buffer gas can also be provided through one or more second buffer gas supplies 135 toward the collector 110 and/or around the edges of the collector 110. Further, the chamber 105 includes one or more gas outlets 140 so that the buffer gas is exhausted outside the chamber 105.

Hydrogen gas has low absorption to the EUV radiation. Hydrogen gas reaching the coating surface of the collector 110 reacts chemically with a metal of the droplet forming a hydride, e.g., metal hydride. When tin (Sn) is used as the droplet, stannane ($SnH_4$), which is a gaseous byproduct of the EUV generation process, is formed. The gaseous $SnH_4$ is then pumped out through the outlet 140.

Figure 2:
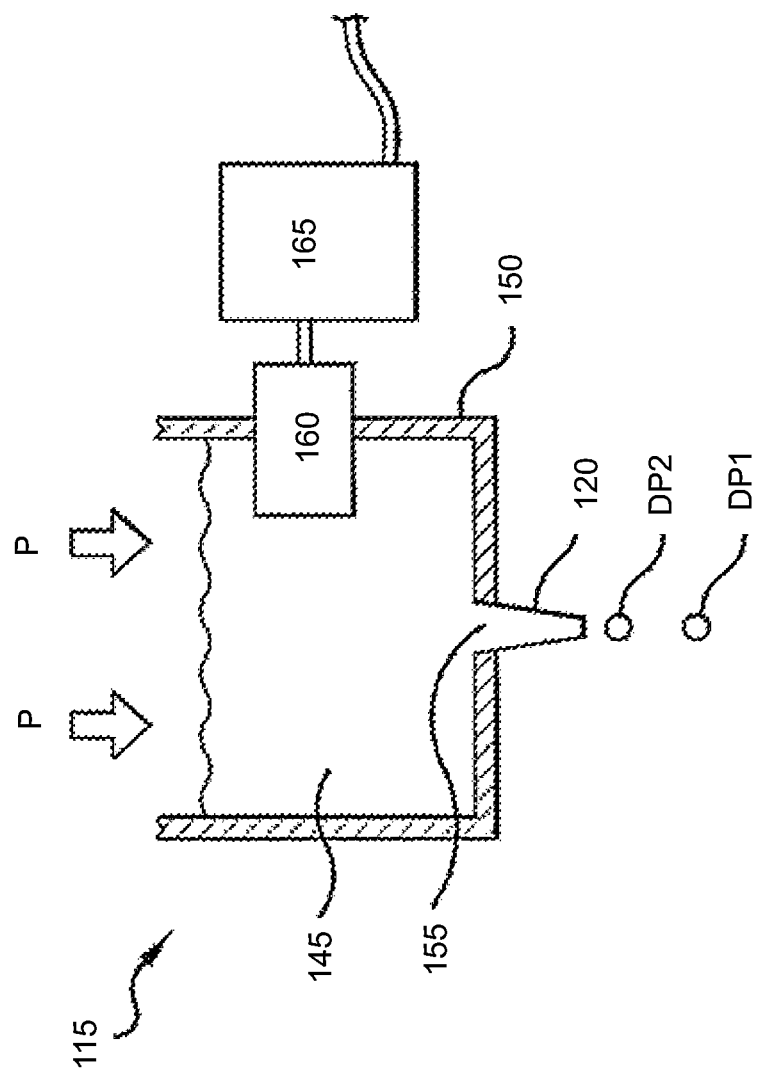
FIG. 2 shows a schematic diagram of a droplet generator according to an embodiment of the disclosure.

FIG. 2 illustrates the components of the droplet generator 115 in schematic format. As shown there, the droplet generator 115 includes a reservoir 150 holding a fluid 145, e.g. molten tin, under pressure P. The reservoir 150 is formed with an orifice 155 allowing the pressurized fluid 145 to flow through the orifice 155 establishing a continuous stream which subsequently breaks into one or more droplets DP1, DP2 exiting the nozzle 120.

The target droplet generator 115 shown further includes a sub-system producing a disturbance in the fluid 145 having an electro-actuatable element 160 that is operably coupled with the fluid 145 and a signal generator 165 driving the electro-actuatable element 160 in some embodiments. In some embodiments, the electro-actuatable element 160 is a piezoelectric actuator that applies vibration to the fluid 145. In some embodiments, the electro-actuatable element 160 is an ultrasonic transducer or a megasonic transducer.

Figure 3:
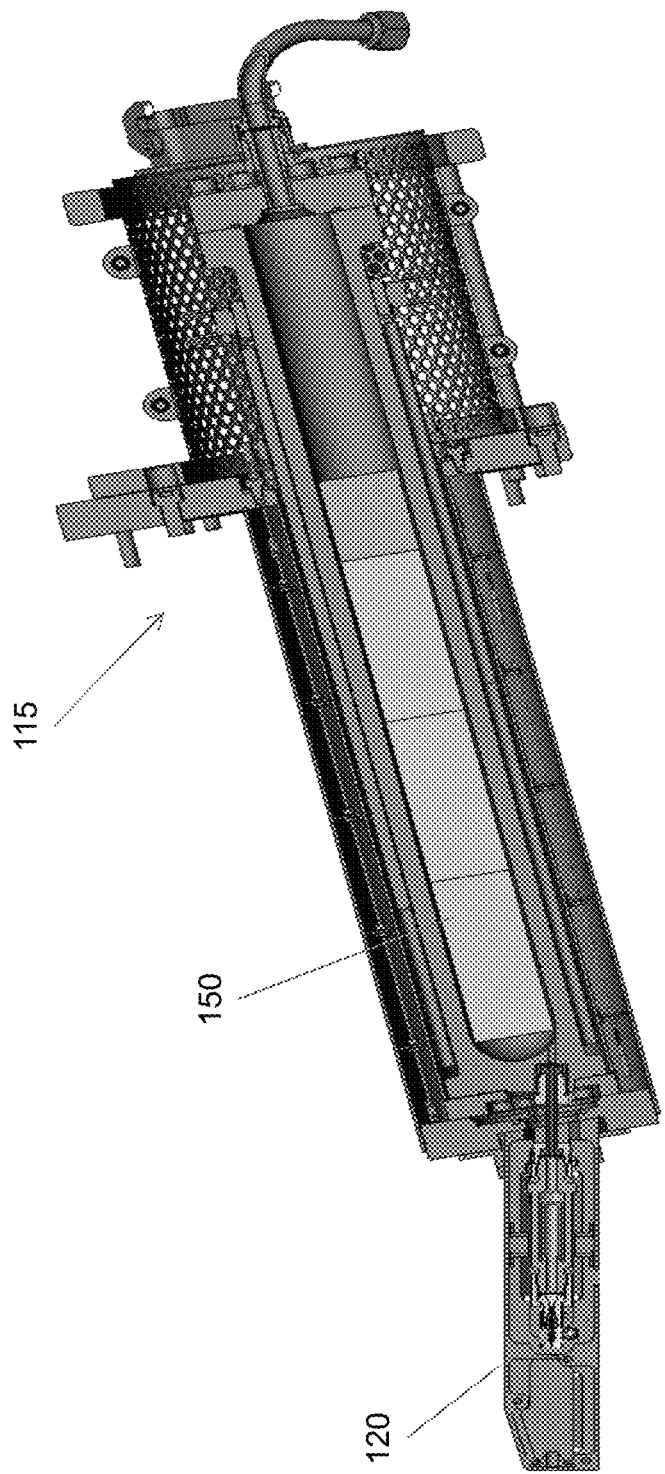
FIG. 3 shows a detailed view of a droplet generator according to an embodiment of the disclosure.

A detailed cross section view of the droplet generator 115 according to an embodiment is shown in FIG. 3. The droplet generator 115 includes a reservoir 150 containing the molten metal 145 and nozzle 120 at the end of the reservoir 150.

In some embodiments, the nozzle 120 is maintained at a certain temperature that is higher than the melting point of the source material. However, under certain conditions such as, for example, if the chamber 105 is vented for a service or if there is an unscheduled change in temperature of the chamber 105, temperature of the nozzle 120 may be reduced to below the melting point of the source material, e.g., tin. When the nozzle 120 cools down, liquid source material may leak through the nozzle 120 because of particulate formation at the nozzle 120. The leaked source material may be deposited on the collector 110 resulting in a reduction in the reflectivity of the collector 110. This in turn results in the loss of stability and efficiency of the EUV radiation source 100. In some cases, replacement of the collector 110 may be required, leading to unnecessary and avoidable expense as well as down-time for the entire lithography system.

In addition, if the chamber 105 is vented the molten source material may react with oxygen in the ambient resulting in the formation of metal oxide particulate contamination. For example, molten tin may react with oxygen forming tin oxide solid particles. The tin oxide particles can coat optical surfaces in the EUVL tool. The metal oxide particles may also clog the nozzle 120 interfering with subsequent droplet flow when the EUVL tool is restarted.

Figure 4:
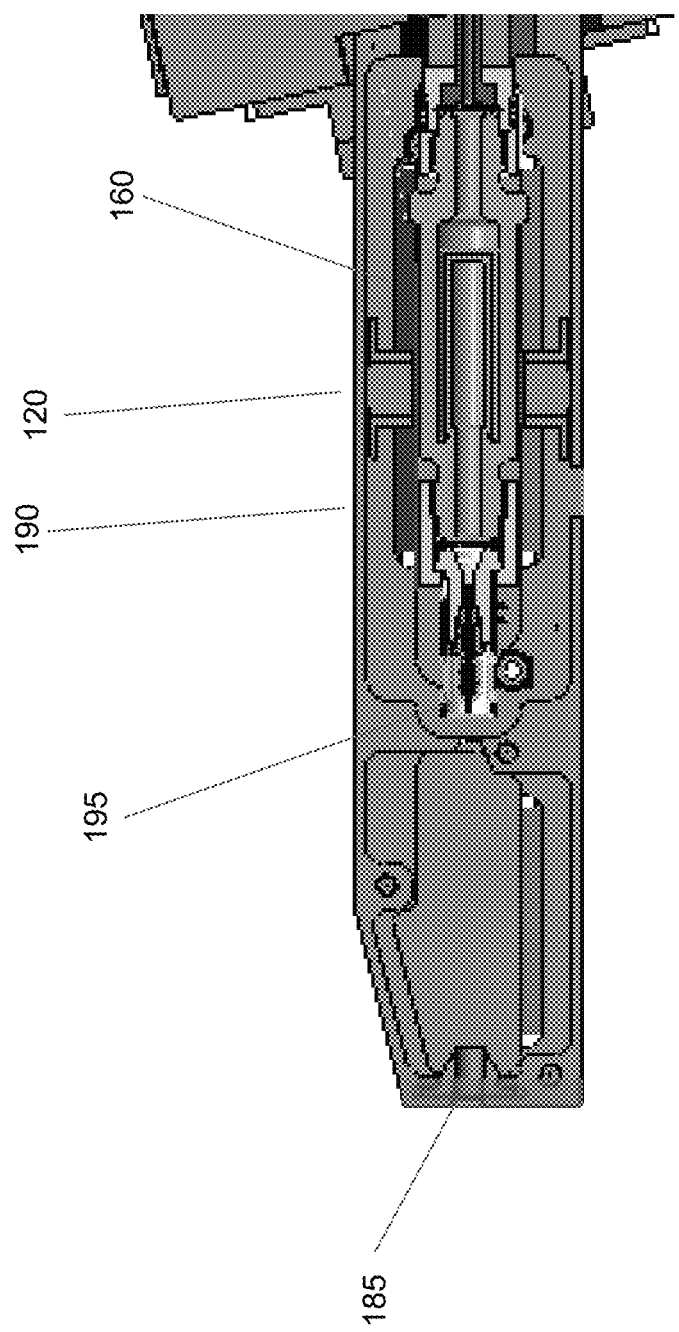
FIG. 4 shows a detailed view of a droplet generator nozzle according to an embodiment of the disclosure.

FIG. 4 shows a detailed view of a droplet generator nozzle 120 according to an embodiment of the disclosure. The outer body 190 of the nozzle 120 is made of a metal, such as titanium or stainless steel in some embodiments. The tip 195 of the nozzle 120, where the droplets DP are generated, is constituted by a strong, non-fragile, material in some embodiments, for example a metal (e.g., titanium), a ceramic, silicon or a silicon based compound, such as silicon nitride. The tip 195 of the nozzle 120 is made of a material that can withstand the temperatures required to maintain the target metal in the molten state and not react with molten target metal 1020. In some embodiments, the tip 195 of the nozzle 120 is made of silicon coated with silicon nitride. Such a tip 195 of the nozzle 120 is able to withstand high pressures within the nozzle 120, and therefore, high gas pressures can be used to force the molten metal through the nozzle 120.

An isolation valve 185 is located at the end of the nozzle 120. The isolation valve 185 is open during operation of the droplet generator 115. When maintenance or servicing of the radiation source 100 is required, the isolation valve 185 closes to seal the nozzle 120. The chamber 105 of the EUV radiation source 100 is maintained under vacuum or low pressure during operation of the EUVL tool. Because EUV light is absorbed by most materials, including gases, it is necessary to operate the EUV tool under low pressure or vacuum to prevent loss of exposure light energy during imaging operations.

The vacuum chamber 105 may be opened when it is necessary to perform maintenance or service the EUVL tool. Exposing the vacuum chamber 105 to the ambient atmosphere introduces oxygen, which readily reacts with heated metals to form metal oxides. For example, the oxygen may react with molten tin in the nozzle 120 of the droplet generator 115 to form tin oxides, such as stannous oxide (SnO) and stannic oxide ($SnO_2$). In some embodiments, the molten tin is maintained at a temperature of about 250° C. At this temperature tin oxides are solid. Thus, any tin oxides that would form would precipitate out of the molten tin. When such cleaning is required, and in particular if the molten tin results in clogging of the droplet generator nozzle 120, the droplet generator 115 may need to be removed from the EUVL tool. This can cause undesirable long downtimes.

Figure 5B:
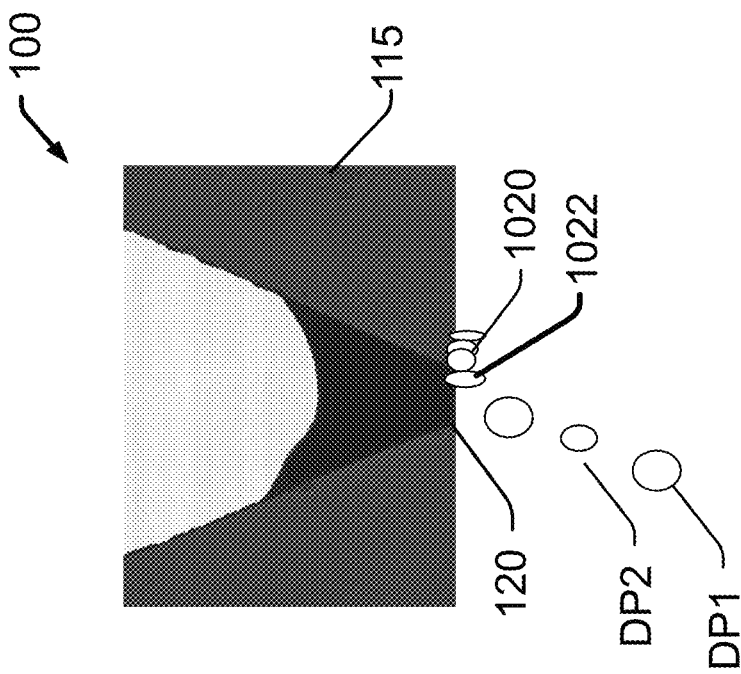
FIGS. 5A-5B show schematic diagrams of generating a droplet by a droplet generator according to an embodiment of the disclosure.
Figure 5A:
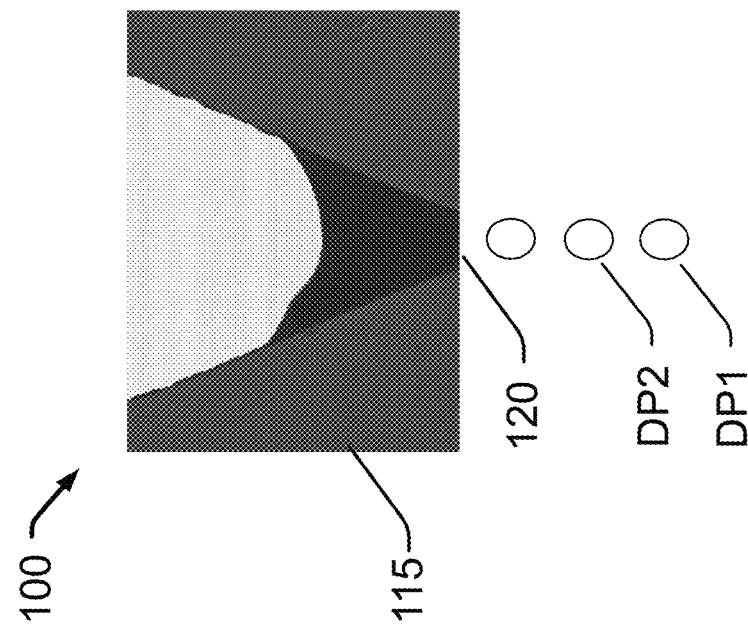

FIG. 5A shows an exemplary stable generation of target droplets DP1, DP2. The target droplets travel from the target droplet generator 115 in the EUV radiation source 100 to the zone of excitation at a uniform (or predictable) speed that contributes to an efficiency and stability of the EUV radiation source 100. The target droplets DP1, DP2 are substantially the same size. As shown in FIG. 5B, the nozzle 120 of the droplet generator 115 may be clogged by a residual material 1022, for example, molten target metal 1020. The target droplets DP1, DP2 are not the same size. In some embodiments, although the target droplets DP1, DP2 are substantially the same size, the target droplets DP1, DP2 may not arrive at the zone of excitation at a desired timing due to the residual material 1022.

Figure 5C:
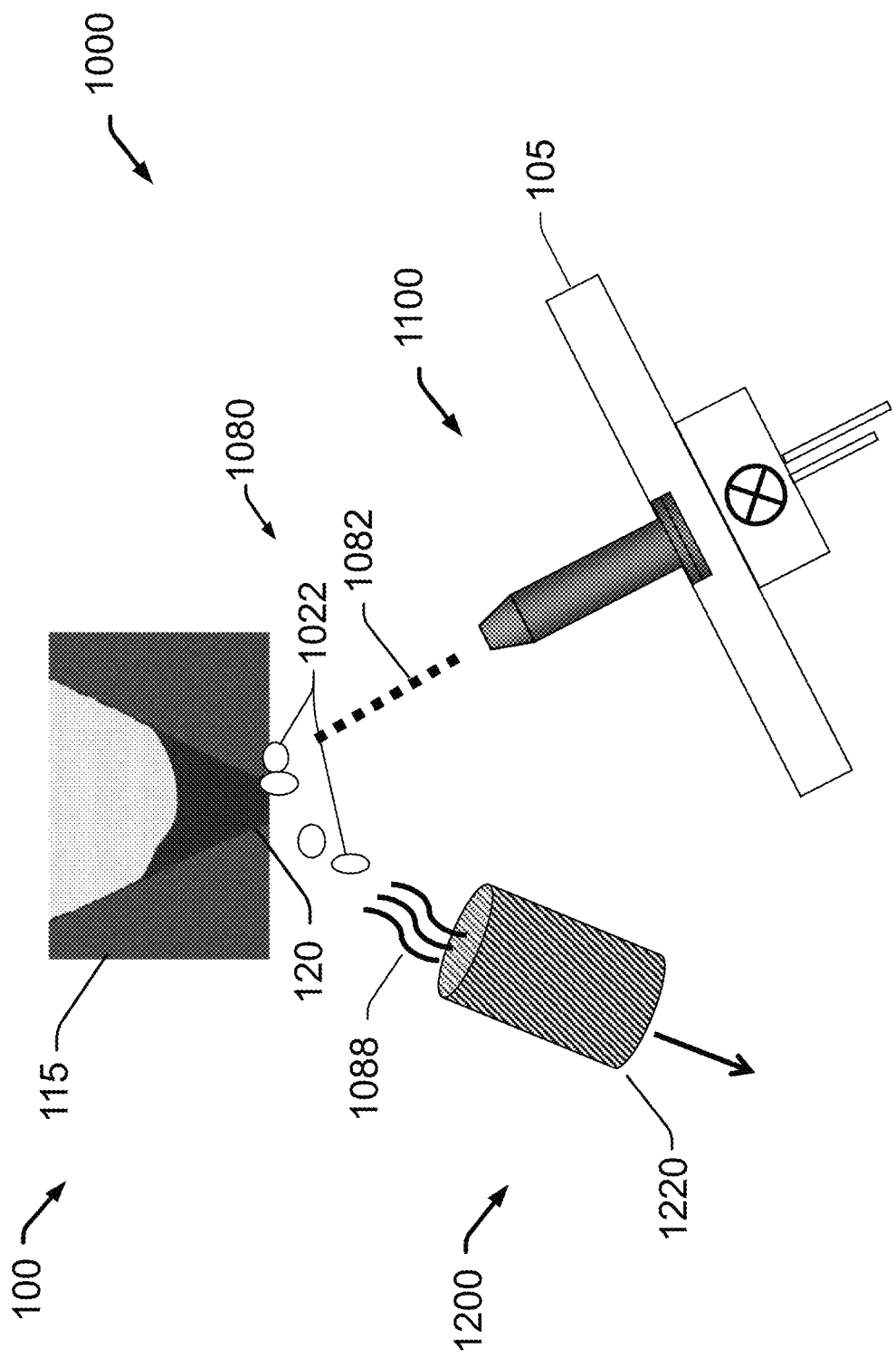
FIG. 5C shows a schematic diagram of a method of cleaning a droplet generator according to an embodiment of the disclosure.

Referring to FIG. 5C, the EUV radiation source apparatus 100 according to the present disclosure includes a dry ice blasting assembly 1000 selectively attachable to and extendable from the chamber 105. The dry ice blasting assembly 1000 includes the blasting member 1100 and the exhaust member 1200 selectively attachable to and extendable from the chamber 105. The blasting member 1100 is configured to direct pressurized dry ice ($CO_2$) particles 1080 to the droplet generator 115 to clean the nozzle 120 and to remove the residual material 1022. The exhaust member 1200 collects the residual material 1022 separated from the nozzle 120 of the droplet generator 115 and gaseous carbon dioxide 1088 sublimated from the solid dry ice particles 1082 through an exhaust line 1220.

Figure 6:
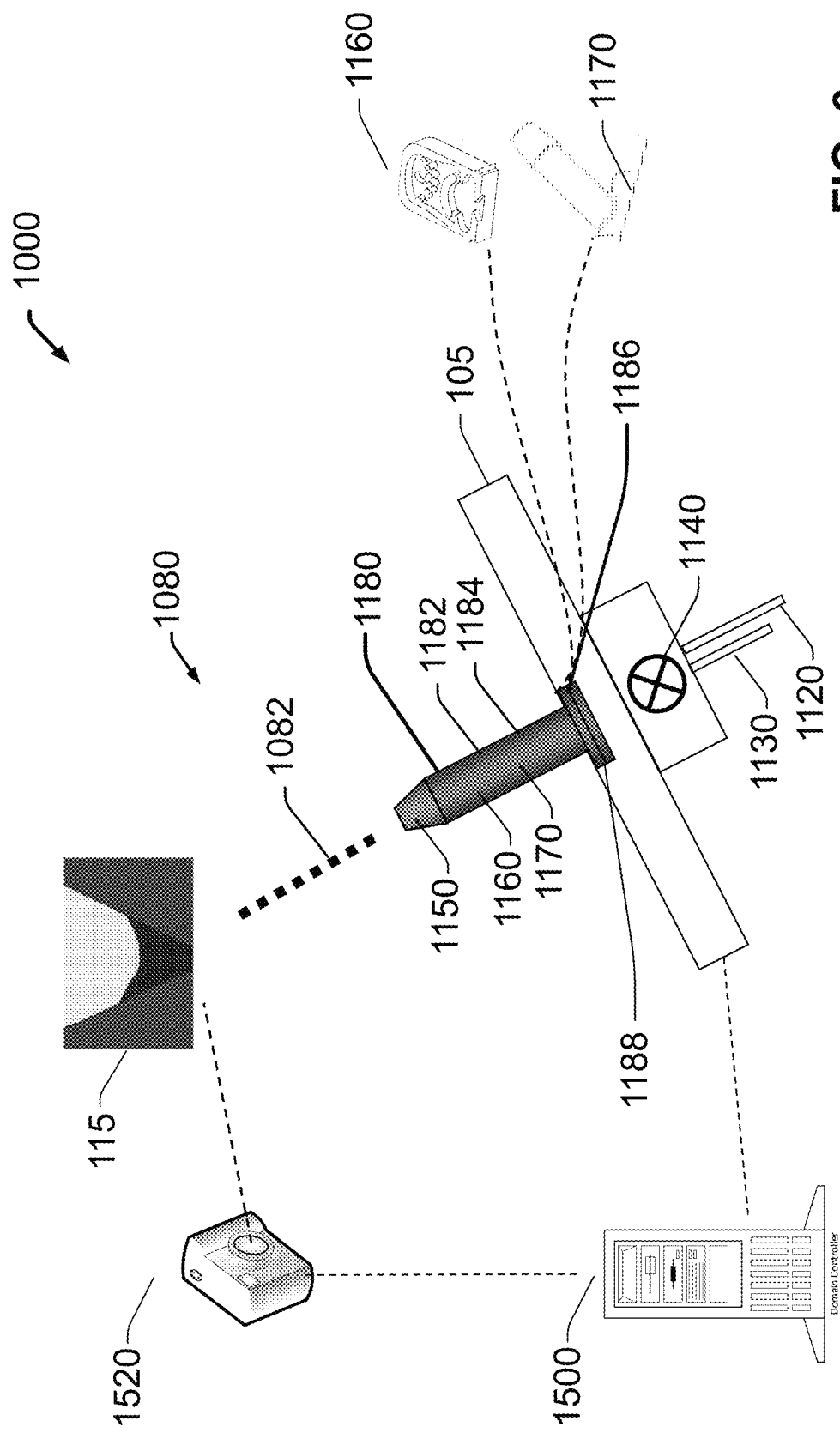
FIG. 6 shows a detailed view of a dry ice blasting assembly according to an embodiment of the disclosure.

With respect to FIG. 6, in some embodiments, the dry ice blasting assembly 1000 includes a blasting air inlet 1120, a blaster carbon dioxide ($CO_2$) inlet 1130, a blasting mixer 1140 and a blasting nozzle 1150. In a particular embodiment, the blasting nozzle 1150 further includes a pulsation insert 1160 and a directional insert 1170. The pulsation insert 1160 is configured to generate a pulsation/oscillation of the pressurized air stream 1084 by inserting a mechanical device into the blasting nozzle 1150. The directional insert 1170 is configured to change a two-dimensional direction and/or three-dimensional rotation of the pressurized air stream 1084 by inserting a mechanical device into the blasting nozzle 1150.

Some embodiments of the dry ice blasting assembly 1000 further include an extendable positioner 1180. The extendable positioner 1180 "pops-up" from the chamber 105 when needed and is substantially concealed within the chamber 105 when not in use. A controller 1500 selectively enables a telescopingly extendable portion 1182 of the extendable positioner 1180 in some embodiments. The telescopingly extendable portion 1182 includes a cylindrical body 1184 that is coaxially slideably received within the chamber 105 and has an inwardly projecting annular flange 1186 which bears against any appropriate type of sealing.

In certain embodiments, the extendable positioner 1180 is a 3-axis rotational device, and when it rotates in a direction, the blasting nozzle 1150 attached to the extendable positioner 1180 is moved to a cleaning position.

In some embodiments, the controller 1500 is configured to monitor residual material 1022 on the droplet generator by a monitoring device 1520, adjust valves of the blasting pump when an amount of residual material 1022 in the droplet generator is more than a threshold amount, and regulate ejecting parameters of the dry ice particles by operating the blasting compressor and the blasting pump when the pressurized dry ice particles are ejected from the blasting nozzle. In some embodiments, the monitoring device is a camera. In some embodiments, the ejection of the pressurized dry ice particles from the blasting nozzle is stopped when the monitoring device detects the amount of the residual material on the droplet generator is below the threshold amount. Any appropriate controlling configuration regarding automatic and/or manual operation is contemplated and is not limited in this regard.

The cleaning position of the dry ice blasting assembly with respect to the nozzle 120 of the droplet generator 115 is programmed by the controller 1500 according to different cleaning modes. For example, the cleaning position may be programmed in a horizontal configuration of the chamber 105. After positioning the blasting nozzle 1150 to the cleaning position (the horizontal configuration of the chamber 105), the extendable positioner 1180 stops moving. The dry ice particles 1082 then clean the droplet generator 115 until the end of a cleaning time 1070.

Figure 7:
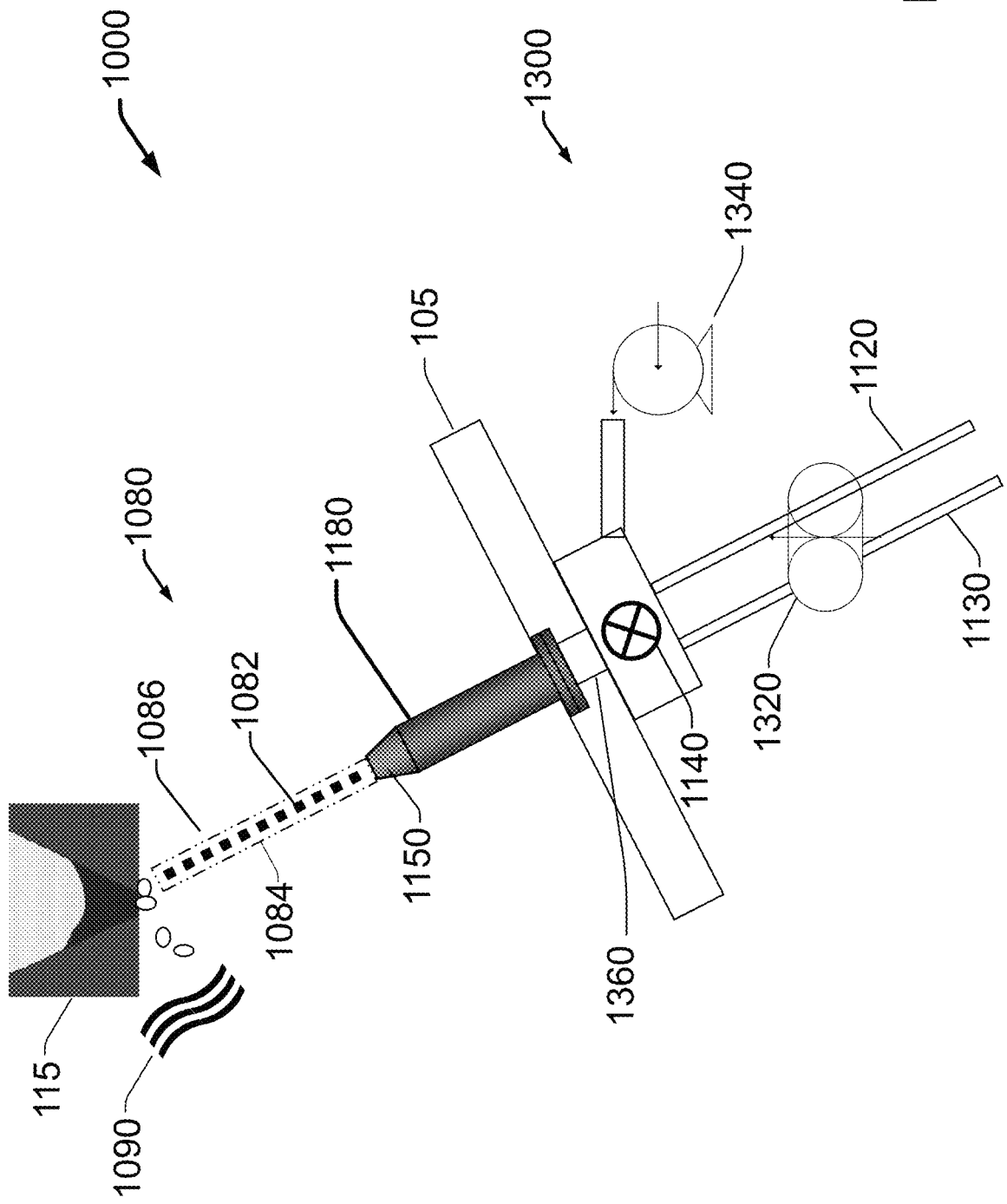
FIG. 7 shows a detailed view of a dry ice blasting assembly according to another embodiment of the disclosure.

As shown in FIG. 7, the dry ice blasting assembly 1000 further includes a supporting member 1300 that includes a blasting compressor 1320 and a blasting pump 1340. The blasting compressor 1320 compresses a liquid form of carbon dioxide from the blaster carbon dioxide ($CO_2$) inlet 1130 into the solid dry ice particles 1082, and pressurizes air taken in from the blasting air inlet 1120. In some embodiments, the inlets 1120, 1130 and the blasting compressor 1320 are located outside of the chamber 105. In some embodiments, the blasting compressor 1320 supplies liquefied nitrogen ($LN_2$) with a pressure of about 2,000 kPa to about 50,000 kPa to the dry ice transport port 1360. In certain embodiments, the blasting compressor 1320 generates the dry ice particles 1082 with a density of about 1,000 g/cm3 to about 200,000 g/cm3. In such configuration, the dry ice particles 1082 impact the nozzle 120 of the droplet generator 115 at a pressure of range of about 1 kPa to about 1000 kPa, and clean the droplet generator 115. In some embodiments, an ultrasonic generator may be used with the dry ice particles 1082 in a frequency of about 20 kHz to about 20 MHz.

In some embodiments, the dry ice blasting assembly 1000 further includes the blasting pump 1340 for mixing dry ice particles 1082 and the pressurized air stream 1084, and for pressurizing the mixture 1086. The pressurized dry ice particles 1080 are ejected from the dry ice blasting assembly 1000, i.e., the blasting nozzle 1150, and directed at the droplet generator nozzle 120. In some embodiments, the flow rate of the pressurized air stream 1084 for the pressurized dry ice particles 1080 is in a range from about 0.5 liters per minute to about 500 liters per minute. Such pressurized dry ice particles 1080 impact the nozzle 120 of the droplet generator 115 at a pressure in a range from about 1 kPa to about 1000 kPa depending on the diameter of the blasting nozzle 1150, the flow rate of the pressurized air stream 1084 for the pressurized dry ice particles 1080, and a distance between the blasting nozzle 1150 and/or the droplet generator nozzle 120.

In some embodiments, the blasting nozzle 1150 has a diameter in a range from about 10 μm to about 10 mm for dispensing pressurized dry ice particles 1080, including the dry ice particles 1082 and the pressurized air stream 1084.

The impact of the dry ice particles 1082 particles creates microscopic shock waves 1090 that help breakdown the tin oxide particulate clogging the droplet generator nozzle 120 in some embodiments. Additionally, because the dry ice particles 1082 immediately sublimate from solid to gas as it impacts the droplet generator nozzle 120, additional solid particulate waste is not left behind. The gaseous carbon dioxide 1088 is relatively inert and does not react with any of the material of other components in the chamber 105. Moreover, gaseous carbon dioxide 1088 can be easily removed from the chamber 105 along with the air as the chamber 105 is being evacuated.

An embodiment of the present disclosure provides a droplet generator 115 cleaning method, including: providing a selectively attachable dry ice blasting assembly 1000. Ejecting the pressured dry ice particles 1080 toward the nozzle 120 of the droplet generator 115 at the pressure of range of about 1 kPa to about 1000 kPa during a cleaning operation wherein the pressured dry ice particles 1080 impact the nozzle 120 of the droplet generator 115. At a pressure in the range of about 1 kPa to about 1000 kPa, the impact of the dry ice particles do not cause damage to the nozzle 120 of the droplet generator 115, the temperature of the residual material 1022 adhered to the nozzle 120 impacted by the dry ice particles is rapidly lowered, the residual material 1022 is embrittled, and a crack is formed between the residual material 1022 and the droplet generator 115. Next, a portion of the dry ice particles 1082 which subsequently impact the droplet generator 115 enters the crack 1024, and the dry ice particles 1082 then rapidly sublimate into gas. Because the volume of the gaseous carbon dioxide 1088 is greater than an original volume of the dry ice particles 1082, the gaseous carbon dioxide 1088 further enlarges the crack 1024 and reduces adhesion of the residual material 1022. In some embodiments, as additional dry ice particles 1082 further impact the residual material, the residual material 1022 is separated from the nozzle 120 of the droplet generator 115, thereby cleaning the nozzle 120 of the droplet generator 115.

By using the foregoing method, the residual material 1022 clogging the nozzle can be effectively removed. In addition, the dry ice particles 1082 are not corrosive, and thus, would not corrode the droplet generator 115. Moreover, the dry ice particles 1082 will rapidly sublimate into carbon dioxide gas after impact, and thus, a contamination medium will not be generated. Thus, without contamination or damaging the nozzle 120 of the droplet generator 115, the droplet generator 115 is cleaned and maintenance and servicing time and/or cost are reduced in embodiments of the disclosure.

An exemplary cleaning procedure according to embodiments of the disclosure is as follows: firstly, the blasting air inlet 1120 transports the compressed air into the blasting mixer 1140, and due to the compressed air, the liquid carbon dioxide is converted into the dry ice particles 1082. The blasting mixer 1140 transports the dry ice particles 1082 via the dry ice transport port 1360 to the blasting nozzle 1150. The blasting nozzle 1150 directs the pressured dry ice particles 1080 to the nozzle 120 of the droplet generator 115 at a pressure in the range of about 1 kPa to about 1000 kPa and a flow rate of the pressurized air stream 1084 for the pressurized dry ice particles 1080 in a range from about 0.5 liters per minute to about 500 liters per minute, to clean the droplet generator 115. In this cleaning procedure, the blasting member 1100 directs the pressurized dry ice particles 1080 to the nozzle 120 of the droplet generator 115 and the microscopic shock waves are generated by the dry ice particles 1082 causing the residual material 1022 to be removed from the nozzle 120 of the droplet generator 115. The exhaust member 1200 collects the residual material 1022 separated from the nozzle 120 of the droplet generator 115 and the gaseous carbon dioxide 1088 sublimated from the dry ice particles 1082 through an exhaust line 1220. Thereby, the cleaning effect is further enhanced by the microscopic shock waves 1090, and contamination inside the chamber 105 is reduced in some embodiments.

An embodiment of the disclosure, as shown in FIG. 8 of a flow chart, is a method S100 of cleaning an extreme ultra violet (EUV) radiation source apparatus. In operation S110, pressurized dry ice particles including dry ice particles and the pressurized air stream from the dry ice supporting member of the dry ice blasting assembly are formed. In operation S120, the pressurized dry ice particles are ejected through the blasting nozzle toward residual material at the nozzle of the target droplet generator. In operation S130, the residual material from the target droplet generator are removed. In operation S140, the residual material and sublimated gaseous carbon dioxide from the pressurized dry ice particles are collected, thereby the EUV radiation source apparatus is cleaned.

In another embodiment, the cleaning system for an extreme ultra violet (EUV) radiation source apparatus includes a target droplet generator for generating a metal droplet, a dry ice blasting assembly, and a chamber that encloses at least the target droplet generator and the dry ice blasting assembly. The dry ice blasting assembly comprises a blasting device, an exhausting device, and a supporting device.

As shown in the flow chart of FIG. 9, another embodiment of the disclosure is a method S200 of cleaning an extreme ultra violet (EUV) radiation source apparatus. In operation S210, a target droplet generator for generating a metal droplet is provided within a chamber. In operation S220, the vacuum in the chamber 105 is removed to allow oxygen to enter the chamber. In operation S230, the oxygen within the chamber reacts with the residual material on the target droplet generator. In operation S240, a dry ice blasting assembly having a blasting nozzle and a dry ice supporting member is provided inside the chamber. In operation S250, pressurized dry ice particles including dry ice particles and the pressurized air stream from the dry ice supporting member are formed. In operation S260, the pressurized dry ice particles are ejected through the blasting nozzle toward the residual material at the nozzle of the target droplet generator. In operation S270, the residual material from the target droplet generator are removed. In operation S280, the residual material and sublimated gaseous carbon dioxide from the pressurized dry ice particles are collected.

Embodiments of the present disclosure provide the benefit of reducing downtime during maintenance and servicing of EUVL tools. The design of the cleaning system and dry ice blasting assembly allows for faster maintenance with reduced servicing time. The adaptation of the cleaning system allows an improved process resulting in reduced manpower required to perform the maintenance, and an increased output of conforming servicing items of the EUVL tools—both of which ultimately result in a cost-savings. As such, the EUVL tool is more efficiently used. However, it will be understood that not all advantages have been necessarily discussed herein, no particular advantage is required for all embodiments or examples, and other embodiments or examples may offer different advantages.

In a particular embodiment, an extreme ultra violet (EUV) radiation source apparatus includes a target droplet generator for generating a metal droplet, a dry ice blasting assembly, a chamber enclosing at least the target droplet generator and the dry ice blasting assembly. The EUV radiation source apparatus also includes a controller communicating with the dry ice blasting assembly and target droplet generator. The dry ice blasting assembly of the EUV radiation source apparatus is selectively attachable to and extendable from the chamber. The dry ice blasting assembly of the EUV radiation source apparatus also includes a blasting device, an exhaust device, and a supporting device.

An embodiment of the disclosure is a method of cleaning an extreme ultra violet (EUV) radiation source apparatus, in which the EUV radiation source apparatus comprises a target droplet generator for generating a metal droplet within a chamber, and a dry ice blasting assembly having a blasting nozzle disposed inside the chamber and a dry ice supporting member. The method includes forming pressurized dry ice particles including dry ice particles and a pressurized air stream from the dry ice supporting member of the dry ice blasting assembly, ejecting the pressurized dry ice particles through the blasting nozzle toward residual material at a nozzle of the target droplet generator, removing the residual material from the target droplet generator, and collecting the residual material and sublimated gaseous carbon dioxide from the pressurized dry ice particles. In an embodiment, the cleaning method includes positioning the blasting nozzle with respect to the residual material by an extendable positioner. In an embodiment, the cleaning method includes oscillating the pressure of the pressurized dry ice particles. In an embodiment, the cleaning method includes monitoring the residual material on the droplet generator, adjusting valves of the blasting pump when an amount of the residual material in the droplet generator is more than a threshold amount, and regulating the operating parameters of the blasting compressor and the blasting pump. In an embodiment, the cleaning method includes positioning a blasting member of the dry ice blasting assembly in the chamber. In an embodiment, the cleaning method includes positioning an exhaust member of the dry ice blasting assembly in the chamber. In an embodiment, the flow rate of the pressurized dry ice particles ejected through the blasting nozzle is in a range from 0.5 liters per minute to 500 liters per minute. In an embodiment, the pressure of the pressurized dry ice particles ejected through the blasting nozzle is in a range of 1 kPa to 1000 kPa at the nozzle. In an embodiment, the pressurized dry ice particles ejected through the blasting nozzle have a diameter in a range from about 10 μm to about 10 mm.

Another embodiment of the disclosure is a method of cleaning an extreme ultra violet (EUV) radiation source apparatus, includes providing a target droplet generator for generating a metal droplet within a chamber. The vacuum of the chamber is removed allowing residual material on the nozzle of the target droplet generator to react with oxygen. A dry ice blasting assembly having a blasting nozzle and a dry ice supporting member is provided inside the chamber. Pressurized dry ice particles including dry ice particles and a pressurized air stream from the dry ice supporting member are formed. The pressurized dry ice particles are ejected through the blasting nozzle toward the residual material at the nozzle of the target droplet generator. The residual material are removed from the target droplet generator, and collected the residual material and sublimated gaseous carbon dioxide from the pressurized dry ice particles. In an embodiment, the cleaning method includes regulating the cleaning using a controller configured to: monitor the residual material on the droplet generator, and compare an amount of the residual material in the droplet generator with a threshold amount to remove the residual material by the pressurized dry ice particles. In an embodiment, the cleaning method includes stopping the ejecting the pressurized dry ice particles when the amount of the residual material in the droplet generator is below the threshold amount.

Another embodiment of the disclosure is a cleaning system for an extreme ultra violet (EUV) radiation source apparatus that includes a target droplet generator for generating a metal droplet, a dry ice blasting assembly and a chamber enclosing at least the target droplet generator and the dry ice blasting assembly. In an embodiment, the dry ice blasting assembly of the cleaning system for the (EUV) radiation source apparatus includes a blasting device, an exhausting device, and a supporting device. In an embodiment, the dry ice blasting assembly of the cleaning system includes a monitoring device for monitoring residual material on the target droplet generator. In an embodiment, the blasting member of the cleaning system includes a blasting air inlet, a blaster carbon dioxide inlet, a blasting mixer and a blasting nozzle. In an embodiment, the blasting nozzle of the cleaning system includes a pulsation insert and a directional insert. In an embodiment, the supporting member of the cleaning system includes a blasting compressor. In an embodiment, the supporting member includes a blasting pump. In an embodiment, the blasting member includes an extendable positioner. In an embodiment, the cleaning system includes a controller configured to monitor residual material on a nozzle of the droplet generator, adjust valves of the blasting pump when an amount of the residual material in the droplet generator is more than a threshold amount, and regulate ejecting parameters of the blasting compressor and the blasting pump, when pressurized dry ice particles are ejected from the blasting nozzle.

Another embodiment of the disclosure is an extreme ultra violet (EUV) radiation source apparatus, including: a target droplet generator for generating a metal droplet, a dry ice blasting assembly, a chamber enclosing at least the target droplet generator and the dry ice blasting assembly, and a controller communicating with the dry ice blasting assembly and target droplet generator. The dry ice blasting assembly of the EUV radiation source is selectively attachable to and extendable from the chamber. The dry ice blasting assembly includes a blasting device, an exhaust device, and a supporting device. In an embodiment, the controller of the EUV radiation source is configured to monitor residual material in the droplet generator and adjust valves of the blasting pump when an amount of the residual material in the droplet generator is more than a threshold amount, and regulate ejecting parameters by operating the blasting compressor and the blasting pump when pressurized dry ice particles are ejected from a blasting nozzle. In an embodiment, the EUV radiation source includes a pulsation insert and a directional insert in the blasting nozzle.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for removing residual material from an extreme ultraviolet (EUV) radiation source, the method comprising:
   generating target droplets of a given material in a droplet generator through a nozzle of the droplet generator;
   monitoring residual material on the droplet generator to measure an amount of the residual material; and
   removing the residual material by ejecting pressurized dry ice particles based on the measured amount of the residual material.

2. The method of claim 1, wherein microscopic shock waves by the pressurized dry ice particles remove the residual material from the target droplet generator.

3. The method of claim 1, further comprising:
   forming the pressurized dry ice particles.

4. The method of claim 3, further comprising:
   forming a pressurized air stream from a cleaner supporting member.

5. The method of claim 1, wherein removing the residual material further comprises collecting the residual material and sublimated gaseous carbon dioxide from the pressurized dry ice particles.

6. The method of claim 1, further comprising:
   adjusting valves of a blasting pump when an amount of the residual material in the droplet generator is more than a threshold amount; and
   regulating operating parameters of a blasting compressor and the blasting pump.

7. The method of claim 1, wherein a flow rate of the pressurized dry ice particles ejected through a cleaner blasting nozzle is in a range from 0.5 liters per minute to 500 liters per minute.

8. The method of claim 1, wherein a pressure of the pressurized dry ice particles ejected through a cleaner blasting nozzle is in a range of 1 kPa to 1000 kPa at the nozzle.

9. The method of claim 1, wherein the pressurized dry ice particles ejected through a cleaner blasting nozzle have a diameter in a range from about 10 μm to about 10 mm.

10. A method for removing residual material in an extreme ultraviolet (EUV) source, the method comprising:
    generating target droplets of a given material in a droplet generator through a nozzle of the droplet generator;
    removing the residual material by a cleaner blasting assembly having a cleaner blasting nozzle; and
    adjusting a pressure of pressurized dry ice particles of the cleaner blasting assembly based on an amount of the residual material removed.

11. The method of claim 10, further comprising an exhaust device configured to collect the residual material.

12. The method of claim 10, further comprising:
    adjusting a pulsation insert configured to generate a pulsation of pressurized air stream of the cleaner blasting nozzle.

13. The method of claim 10, further comprising:
    adjusting a supporting member including a blasting compressor.

14. The method of claim 10, further comprising:
    adjusting valves of a blasting pump when the amount of the residual material in the droplet generator is more than a threshold amount.

15. The method of claim 10, further comprising:
    regulating ejecting parameters of a blasting compressor and the blasting pump, when pressurized dry ice particles are ejected from a cleaner blasting nozzle.

16. The method of claim 10, wherein the cleaner blasting assembly is selectively attachable to and extendable from a chamber.

17. A cleaning apparatus for an extreme ultraviolet (EUV) radiation source, comprising:
    a cleaner blasting assembly having a cleaner blasting nozzle to remove residual material from a target droplet generator;
    an imaging device configured to monitor the residual material on the droplet generator; and
    a controller communicating with the cleaner blasting assembly and the imaging device configured to adjust cleaning modes and position of the cleaner blasting assembly to enhance the cleaning effect.

18. The cleaning apparatus of claim 17, wherein the controller regulates ejecting parameters of a blasting compressor and the blasting pump, when pressurized dry ice particles are ejected from the blasting nozzle.

19. The cleaning apparatus of claim 18, wherein the controller stops the ejection of the pressurized dry ice particles when an amount of the residual material on the droplet generator is below a threshold amount.

20. The cleaning apparatus of claim 17, wherein the controller further include an exhaust device to collect the residual material and sublimated gaseous carbon dioxide from pressurized dry ice particles.

* * * * *